(12) United States Patent
Kim et al.

(10) Patent No.: US 6,738,278 B2
(45) Date of Patent: May 18, 2004

(54) CACHE MEMORY DEVICE INCLUDING WORD LINE DRIVER CIRCUIT AND METHOD

(75) Inventors: Jin Sung Kim, Suwon (KR); Kwang-il Kim, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/434,051

(22) Filed: May 8, 2003

(65) Prior Publication Data

US 2004/0027845 A1 Feb. 12, 2004

(30) Foreign Application Priority Data

Aug. 10, 2002 (KR) ........................................ 2002/47379

(51) Int. Cl.$^7$ .............................................. G11C 13/00
(52) U.S. Cl. ................ 365/49; 365/189.05; 365/189.08
(58) Field of Search .............................. 365/49, 189.06, 365/230.06, 189.08, 189.05, 200, 189.07

(56) References Cited

U.S. PATENT DOCUMENTS

| | | | | |
|---|---|---|---|---|
| 5,715,188 A | * | 2/1998 | Covino et al. ................. | 365/49 |
| 5,905,680 A | | 5/1999 | Bosshart ................. | 365/189.07 |
| 6,058,038 A | | 5/2000 | Osada et al. ................... | 365/49 |
| 6,222,752 B1 | | 4/2001 | Kumar et al. .................. | 365/49 |
| 6,564,344 B1 | * | 5/2003 | Bui et al. .................... | 714/718 |

* cited by examiner

*Primary Examiner*—Van Thu Nguyen
*Assistant Examiner*—Hien Nguyen
(74) *Attorney, Agent, or Firm*—F. Chau & Associates, LLC

(57) ABSTRACT

A cache memory device and method are provided with a word line driver circuit that can increase the operational speed of the cache memory device and yield a reduction in the chip area of a semiconductor integrated circuit, where a cache memory device includes a first memory cell block, a second memory cell block, a plurality of first content addressable memory ("CAM") cells, a plurality of second CAM cells, a first word line driver circuit, and a second word line driver circuit; and a corresponding method provides that the plurality of first content addressable memory ("CAM") cells stores a tag address of the first memory cell block commonly connected to a first dynamic node, and the plurality of second CAM cells stores a tag address of the second memory cell block commonly connected to a second dynamic node; the first and second dynamic nodes are initially precharged to a predetermined level; the precharged predetermined level of one of the first and second dynamic nodes is maintained and the other one is discharged when an address is input from a CPU; and in particular, the first word line driver circuit activates the word line of the first memory cell block when the predetermined level of the first dynamic node is maintained and the second dynamic node is discharged, and the second word line driver circuit activates the word line of the second memory cell block when the predetermined level of the second dynamic node is maintained and the first dynamic node is discharged.

33 Claims, 5 Drawing Sheets

CACHE MEMORY DEVICE INCLUDING WORD LINE DRIVER CIRCUIT AND METHOD

BACKGROUND OF THE INVENTION

1. Field of the Invention

The present invention relates to cache memories, and more particularly, to a cache memory device including a word line driver circuit and method capable of increasing operational speed and yielding a reduction in the chip area of a semiconductor integrated circuit.

2. Description of the Related Art

A typical computer system includes main memory, such as dynamic random access memory ("DRAM"), and cache memory. Each memory cell block in the cache memory has an inherent tag address, and each tag address is checked to determine whether it is the same as an address received from a central processing unit ("CPU"). Content addressable memory ("CAM") is used in comparing each tag address with an address received from the CPU. In general, the case where a tag address is the same as an address input from a CPU is called a 'hit', and the reverse case is called a 'miss'.

FIG. 1 is a schematic block diagram of a typical cache memory device 100 having CAM cells, and FIG. 2 is a detailed circuit diagram of a typical CAM cell 200. Referring to FIG. 1, a tag address for a memory cell block 101 is stored in CAMs CAM11 through CAM1n, a tag address for a memory cell block 102 is stored in CAMs CAM21 through CAM2n, and that for a memory cell block 103 is stored in CAMs CAMm1 through CAMmn. Only one of the stored tag addresses will be the same as an address input from a CPU (not shown), so that a 'hit' occurs only once.

A dynamic node CHIT1 is commonly connected to the CAMs CAM11 through CAM1n, and a dynamic node CHIT2 is commonly connected to the CAMs CAM21 through CAM2n. Similarly, a dynamic node CHITm is commonly connected to CAMs CAMm1 through CAMmn.

All of the dynamic nodes CHIT1 through CHITm are initially precharged to a line voltage level. The precharged line voltage level of each dynamic node is maintained if an address input from the CPU is the same as the tag address stored in the related CAMs, i.e., if a 'hit' occurs. If this is not so, i.e., if a 'miss' occurs, each dynamic node discharges until reaching a ground voltage level.

For instance, when an n-bit address input from the CPU is the same as a tag address stored in the CAMs CAM11 through CAM1n, the precharged line voltage level of only the dynamic node CHIT1 is maintained and the other dynamic nodes CHIT2 through CHITm discharge until reaching a ground voltage level.

As a result, only a word line driver circuit 104 connected to the dynamic node CHIT1 is enabled, and only a word line WL1 of the memory cell block 101 is activated. Word line driver circuits 105 and 106 connected to the other dynamic nodes CHIT2 and CHITm are disabled, and the word lines WL2 through WLm are inactivated.

A comparison of a tag address with an address input from a CPU using CAMs has a first problem in that it is difficult to know the exact point in time when the comparison has completed according to the structural features of a CAM. This first problem will now be described in detail with reference to the CAM cell 200 shown in FIG. 2. First, an input of a precharge signal PCH having logic '0' causes a precharge PMOS transistor P1 to turn on and a dynamic node CHIT to be precharged to a line voltage level VDD. After a predetermined amount of time, the precharge signal PCH reaches logic '1', which causes the precharge PMOS transistor P1 to turn off and an NMOS transistor N4 to turn on.

If one bit TA of a tag address stored in a CAM cell shown in FIG. 2 is at logic '1' and one bit CA of an address input from a CPU (not shown) is at logic '0', i.e., a complementary bit TAB of the bit TA is at logic '0' and a complementary bit CAB of the bit CA is at logic '1', a transmission gate TM2 is turned on, a transmission gate TM1 is turned off, and a pull-down NMOS transistor N3 is turned on. As a result, the dynamic node CHIT discharges until reaching a ground voltage level VSS.

Meanwhile, if the bit TA of a tag address stored in a CAM cell is at logic '1' and the bit CA of the address input from the CPU is at logic '1', i.e., a complementary bit TAB of the bit TA is at logic '0' and a complementary bit CAB of the bit CA is at logic '0', the transmission gate TM2 is turned on, the transmission gate TM1 is turned off, and a pull-down NMOS transistor N3 is turned off. As a result, the precharged line voltage level of the dynamic node CHIT is maintained.

In other words, in the event that the bit TA of the tag address stored in the CAM cell is not the same as the bit CA of the address input from the CPU, i.e., a 'miss' occurs, the dynamic node CHIT discharges until reaching a ground voltage level VSS. However, if the bit TA of the tag address stored in the CAM cell is the same as the bit CA of the address input from the CPU, i.e., a 'hit' occurs, the precharged line voltage level VDD of the dynamic node CHIT is maintained.

In the latter case, i.e., when a 'hit' occurs, a second problem is that it is difficult to know the exact point in time when the comparison of a tag address and an address input from a CPU has completed since the precharged level of the dynamic node CHIT is maintained, i.e., an event due to transition does not occur.

Turning to FIG. 3, a conventional method of solving this second problem is described with respect to a typical cache memory device 300. The device 300 uses a dummy CAM miss path that is made to be always mismatched. Thus, a path having dummy CAM cells 1 through n is commonly connected to a dummy dynamic node Dummy CHIT. The dummy dynamic node Dummy CHIT is commonly connected to word line drivers 304 through 306.

The dummy CAM miss path models the CAM miss path for a worst case scenario so that a 'miss hit' always occurs in the dummy CAM miss path. The CAM miss path for a worst case scenario refers to a CAM miss path having the slowest discharging operation in which only one cell of the CAM cells, which are connected to the dynamic node Dummy CHIT, is discharged.

However, it is difficult to design the dummy CAM miss path completely based on the model of the CAM miss path for the worst case scenario by the conventional method of using the cache memory device of FIG. 3. Even if the dummy miss path completely models the CAM miss path for the worst case during the design of a semiconductor integrated circuit, the timing of the dummy CAM miss path may be not the same as that of the CAM miss path for the worst case scenario, due to a variation in a process of fabricating a semiconductor integrated circuit or variation in temperature. This difference would lower the operational speed of the cache memory device of FIG. 3 using the conventional method.

Also, the conventional method requires the inclusion of a dummy CAM miss path including dummy CAM cells 1 through n into a semiconductor integrated circuit 300 as shown in FIG. 3, thereby increasing the chip area of such a semiconductor integrated circuit.

SUMMARY OF THE INVENTION

The present invention provides a cache memory device having a word line driver circuit that is capable of increasing the operational speed of the cache memory device and causing a reduction in the chip area of a semiconductor integrated circuit.

The present invention also provides a method of driving a word line of a cache memory device that increases the operational speed of the cache memory device and causes a reduction in the chip area of a semiconductor integrated circuit.

According to one aspect of the present invention, there is provided a cache memory device including a first memory cell block; a second memory cell block; a plurality of first content addressable memory ("CAM") cells for storing a tag address of the first memory cell block and commonly connected to a first dynamic node; a plurality of second CAM cells for storing a tag address of the second memory cell block and commonly connected to a second dynamic node; and a first word line driver circuit for driving a word line of the first memory cell block in response to signals output from the first and second dynamic nodes.

The cache memory device further includes a second word line driver circuit for driving a word line of the second memory cell block in response to signals output from the first and second dynamic nodes.

The first and second dynamic nodes are initially precharged to a predetermined level. The precharged predetermined level of one of the first and second dynamic nodes is maintained and the other one is discharged, when an address is input from a CPU.

The first word line driver circuit activates the word line of the first memory cell block when the predetermined level of the first dynamic node is maintained and the second dynamic node is discharged. The second word line driver circuit activates the word line of the second memory cell block when the predetermined level of the second dynamic node is maintained and the first dynamic node is discharged.

According to another aspect of the present invention, there is provided a cache memory device including a first memory cell block; a second memory cell block; a third memory cell block; a plurality of first CAM cells for storing a tag address of the first memory cell block and commonly connected to a first dynamic node; a plurality of second CAM cells for storing a tag address of the second memory cell and commonly connected to a second dynamic node; a plurality of third CAM cells for storing a tag address of the third memory cell block and commonly connected to a third dynamic node; a first word line driver circuit for driving a word line of the first memory cell block in response to signals output from the first and second dynamic nodes; and a second word line driver circuit for driving a word line of the second memory cell block in response to signals output from the second and third dynamic nodes.

The cache memory device further includes a plurality of dummy CAM cells connected to a dummy dynamic node; and a third word line driver circuit for driving the third memory cell block in response to signals output from the third dynamic node and the dummy dynamic node.

The first through third dynamic nodes and the dummy dynamic node are initially precharged to a predetermined level. The precharged predetermined level of only one of the first through third dynamic nodes is maintained and the others are discharged when an address is input from a CPU.

The first word line driver circuit activates a word line of the first memory cell block when the predetermined level of the first dynamic node is maintained and the second dynamic node is discharged. The second word line driver circuit activates a word line of the second memory cell block when the predetermined level of the second dynamic node is maintained and the third dynamic node is discharged. The third word line driver circuit activates a word line of the third memory cell block when the predetermined level of the third dynamic node is maintained and the dummy dynamic node is discharged.

According to still another aspect of the present invention, there is provided a method of driving a word line of a cache memory device including a first memory cell block, a second memory cell block, a plurality of first CAM cells for storing a tag address for the first memory cell block and commonly connected to a first dynamic node, and a plurality of second CAM cells for storing a tag address of the second memory cell block and commonly connected to a second dynamic node, the method including initially precharging the first and second dynamic nodes to a predetermined level; maintaining the precharged predetermined level of the first dynamic node when an address input from the CPU is the same as a tag address stored in the plurality of first CAM cells and, in the reverse case, discharging the first dynamic node; maintaining the precharged predetermined level of the second dynamic node when the address input from a CPU is the same as a tag address stored in the plurality of second CAM cells and, in the reverse case, discharging the second dynamic node; and activating a word line of the first memory cell block when the predetermined level of the first dynamic node is maintained and the second dynamic node is discharged. The method further includes activating a word line of the second memory cell block when the predetermined level of the second dynamic node is maintained and the first dynamic node has discharged.

According to still another aspect of the present invention, there is provided a method of driving a word line of a cache memory device including a first memory cell block, a second memory cell block, a third memory cell block, a plurality of first CAM cells for storing a tag address for the first memory cell block and commonly connected to a first dynamic node, a plurality of second CAM cells for storing a tag address of the second memory cell block and commonly connected to a second dynamic node, a plurality of third CAM cells for storing a tag address of the third memory cell block and commonly connected to a third dynamic node, and a plurality of dummy CAM cells commonly connected to a dummy dynamic node, the method including initially precharging the first through third dynamic nodes and the dummy dynamic node to a predetermined level; maintaining the precharged predetermined level of the first dynamic node when an address input from a CPU is the same as a tag address stored in the plurality of first CAM cells and, in the reverse case, discharging the first dynamic node; maintaining the precharged predetermined level of the second dynamic node when the address input from the CPU is the same as a tag address stored in the plurality of second CAM cells and, in the reverse case, discharging the second dynamic node; maintaining the precharged predetermined level of the third dynamic node when the address input from the CPU is the same as a tag address stored in the plurality of third CAM cells and, in the reverse case, discharging the third dynamic node; activating a word line of the first memory cell block when the predetermined level of the first dynamic node is maintained and the second dynamic node is discharged; and activating a word line of the second memory cell block when the predetermined level of the second dynamic node is maintained and the third dynamic node is discharged.

The method further includes maintaining the precharged predetermined level of the dummy dynamic node when the address input from the CPU is the same as a tag address stored in the plurality of dummy CAM cells and, in the reverse case, discharging the dummy dynamic node; and activating a word line of the third memory cell block when the predetermined level of the third dynamic node is maintained and the dummy dynamic node is discharged.

BRIEF DESCRIPTION OF THE DRAWINGS

The above and other objects and advantages of the present invention will become more apparent by describing in detail preferred embodiments thereof with reference to the attached drawings, in which.

DETAILED DESCRIPTION OF PREFERRED EMBODIMENTS

Figure 4:
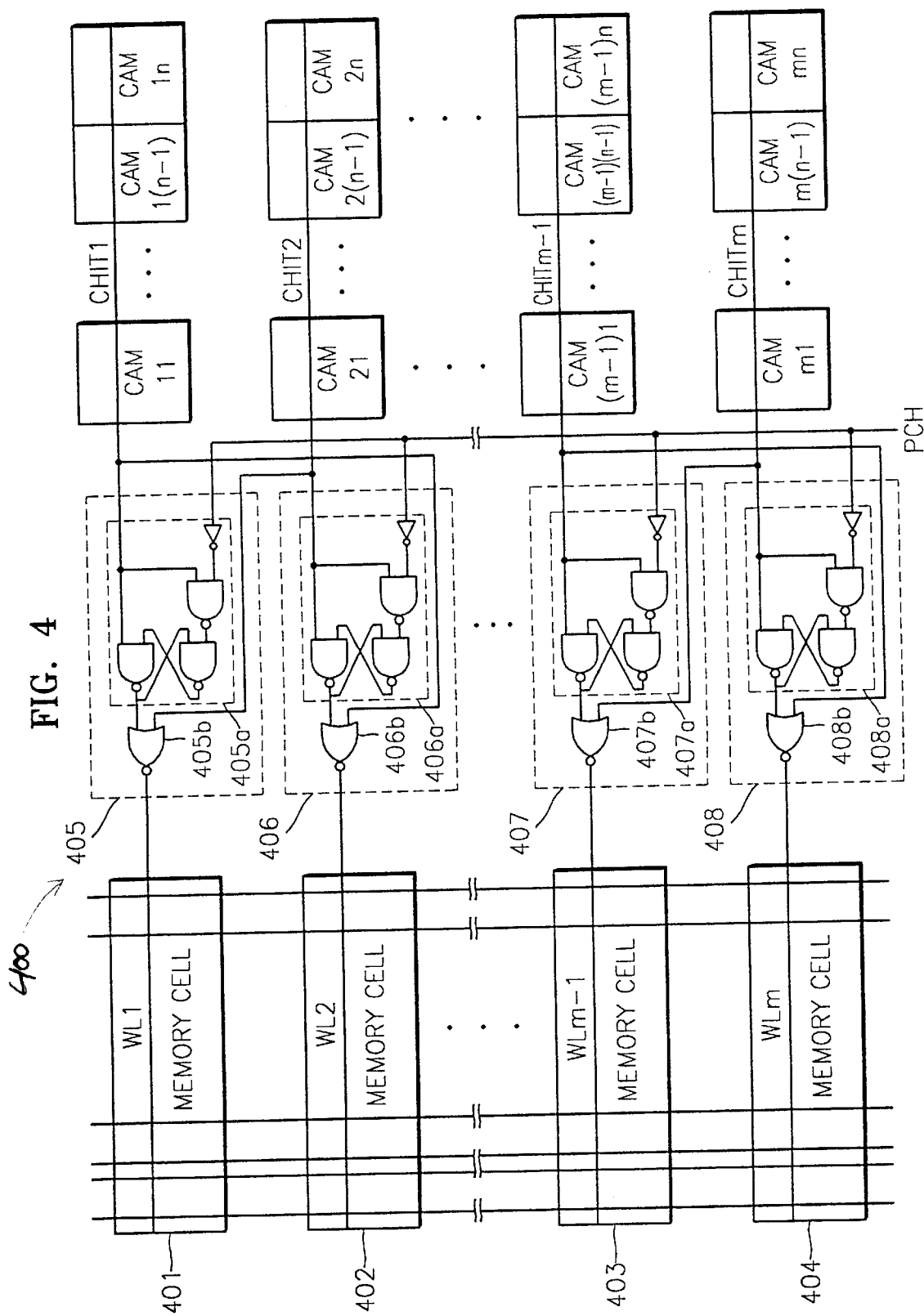
FIG. 4 is a block diagram of a cache memory device according to a preferred embodiment of the present invention.

As shown in FIG. 4, a block diagram of a cache memory device according to a preferred embodiment of the present invention is indicated generally by the reference numeral 400. The cache memory device 400 includes a plurality of memory cell blocks 401 through 404, a plurality of content addressable memory ("CAM") cells 11 through 1n, ..., m1 through mn, and a plurality of word line driver circuits 405 through 408.

The plurality of first CAM cells 11 through 1n store a tag address of the first memory cell block 401 and are commonly connected to a first dynamic node CHIT1. The plurality of second CAM cells 21 through 2n store a tag address of the second memory cell block 402 and are commonly connected to a second dynamic node CHIT2. Similarly, the plurality of $m_{th}$ CAM cells m1 through mn store a tag address of the $m_{th}$ memory cell block 404 and are commonly connected to an $m_{th}$ dynamic node CHITm.

Figure 1:
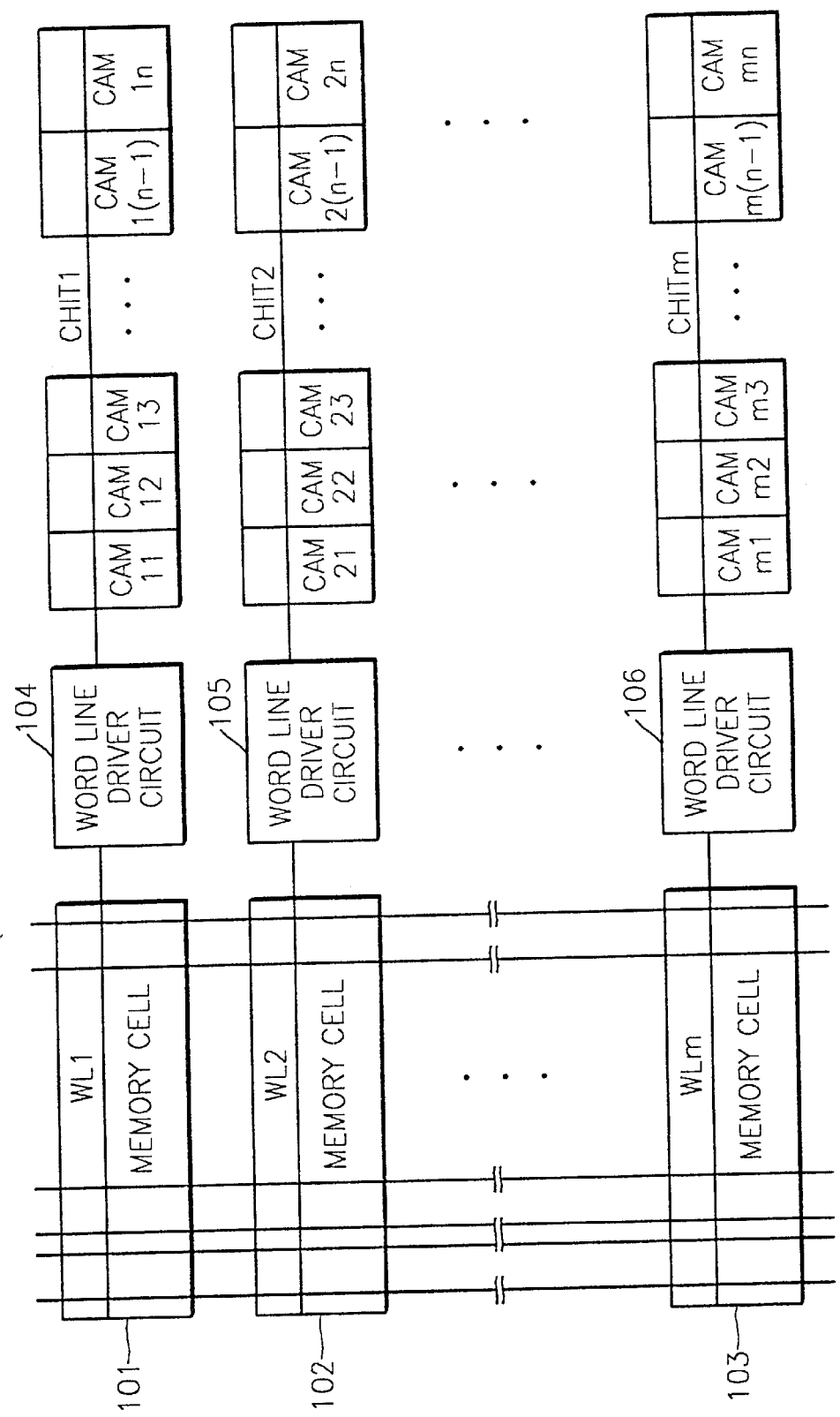
FIG. 1 is a block diagram of a conventional cache memory device including a content addressable memory ("CAM")
Figure 2:
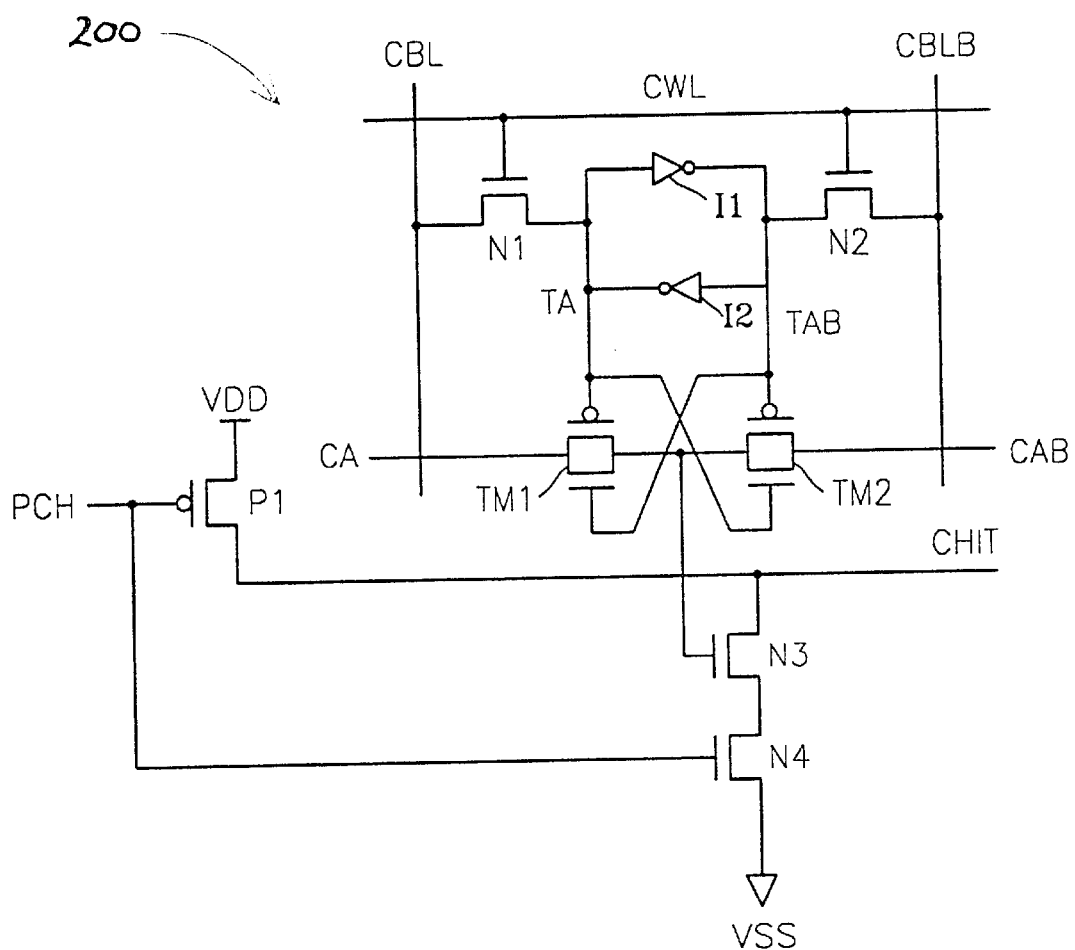
FIG. 2 is a circuit diagram of a conventional CAM cell.
Figure 3:
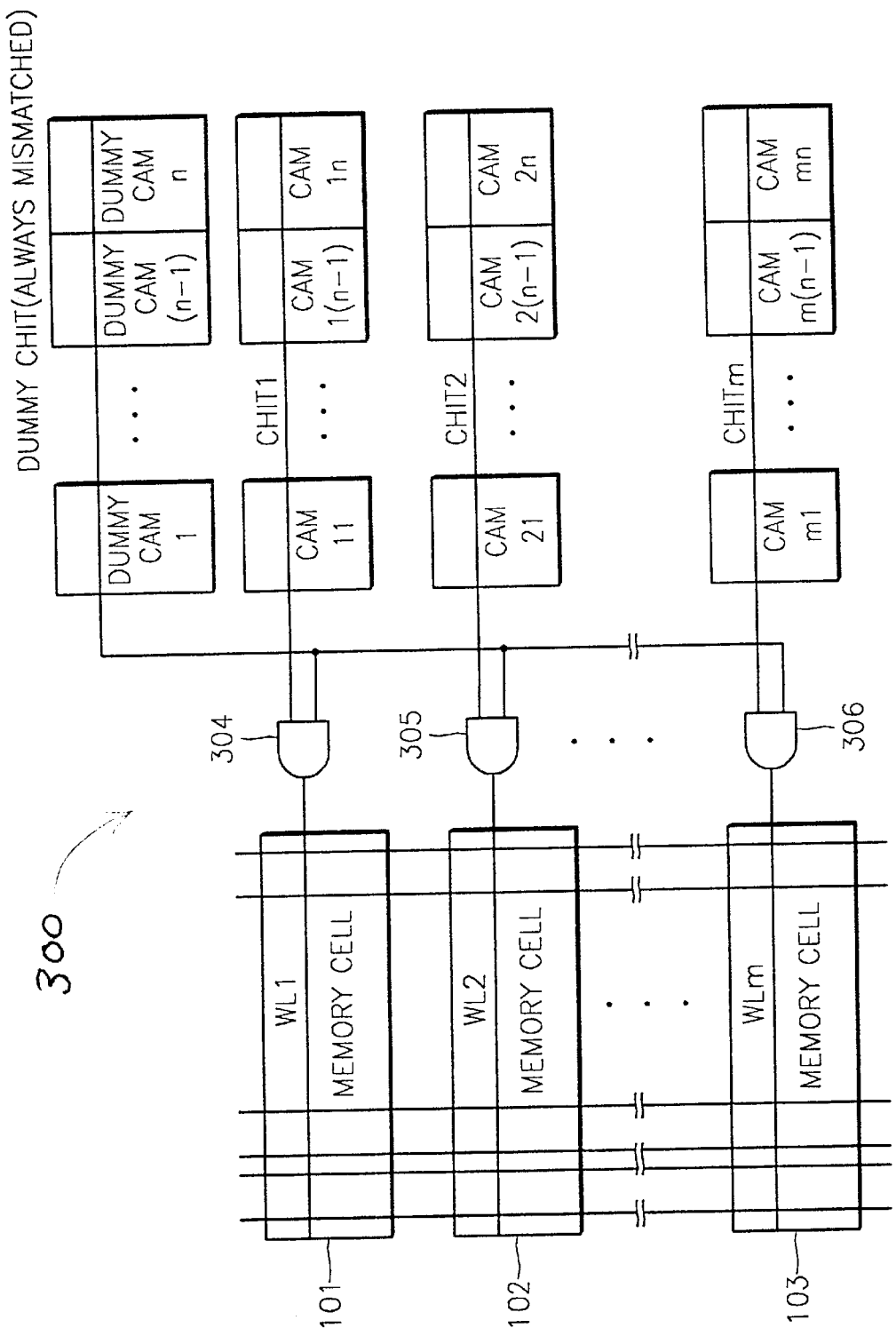
FIG. 3 is a block diagram of another conventional cache memory device.

The structures of the CAM cells 11 to 1n through m1 to mn are as shown in FIG. 2, and thus, the first through $m_{th}$ dynamic nodes CHIT1–CHITm are initially precharged to a line voltage level VDD. In addition, one of the tag addresses stored in certain CAMs corresponds to an address input from a central processing unit ("CPU") (not shown). That is, the CAMs are made such that a 'hit' occurs only once therein. Therefore, when an address is input from the CPU, the precharged line voltage level VDD of only one of the first through $M_{th}$ dynamic nodes CHIT1–CHITm is maintained and the remaining dynamic nodes discharge until reaching a ground voltage level VSS.

For instance, if an address input from the CPU is identical with a tag address stored in the plurality of first CAM cells 11 through 1n, the precharged line voltage level of the first dynamic node CHIT1 is maintained. If this is not so, the first dynamic node CHIT1 discharges to a ground voltage level VSS. If the address input from the CPU is identical with a tag address stored in the plurality of second CAM cells 21 through 2n, the precharged line voltage level of the second dynamic node CHIT2 is maintained. If this is not so, the second dynamic node CHIT2 discharges until reaching the ground voltage level VSS. Likewise, if the address input from the CPU is identical with a tag address stored in the plurality of $m_{th}$ CAM cells m1 to mn, the precharged line voltage level of the $m_{th}$ dynamic node CHITm is maintained. If this is not so, the $m_{th}$ dynamic node CHITm discharges until reaching the ground voltage level VSS.

Each of the word line driver circuits 405 through 408 drives a word line of a corresponding memory cell block in response to signals output from two adjacent dynamic nodes, and operates according to a method of driving a word line according to the present invention. For instance, the first word line driver circuit 405 drives a word line WL1 of the first memory cell block 401 in response to signals output from the first and second dynamic nodes CHIT1 and CHIT2. The second word line driver circuit 406 drives a word line WL2 of the second memory cell block 402 in response to signals output from the first and second dynamic nodes CHIT2 and CHIT1. Likewise, the $m_{th}$ word line driver circuit 408 drives a word line WLm of the $m_{th}$ memory cell block 404 in response to signals output from the $m_{th}$ and m-1$_{th}$ dynamic nodes CHITm and CHITm-1.

More specifically, the first word line driver circuit 405 includes an inversion latch 405a for inverting and latching a signal output from the first dynamic node CHIT1, and a NOR gate 405b for performing a NOR operation on a signal output from the inversion latch 405a and a signal output from the second dynamic node CHIT2 and providing the NOR operation result to the word line WL1 of the first memory cell block 401. Thus, the first word line driver circuit 405 activates the word line WL1 of the first memory cell block 401 at logic 'high' level when the line voltage level VDD of the first dynamic node CHIT1 is maintained and the second dynamic node CHIT2 discharges until reaching the ground voltage level VSS.

The second word line driver circuit 406 includes an inversion latch 406a for inverting and latching a signal output from the second dynamic node CHIT2, and a NOR gate 406b for performing a NOR operation on a signal output from the inversion latch 406a and a signal output from the first dynamic node CHIT1 and providing the NOR operation result to the word line WL2 of the second memory cell block 402. Thus, the second word line driver circuit 406 activates the word line WL2 of the second memory cell block 402 to logic 'high' level when the line voltage level VDD of the second dynamic node CHIT2 is maintained and the first dynamic node CHIT1 discharges until reaching the ground voltage level VSS.

Likewise, the $m_{th}$ word line driver circuit 408 includes an inversion latch 408a for inverting and latching a signal output from the $m_{th}$ dynamic node CHITm, and a NOR gate 408b for performing a NOR operation on a signal output from the inversion latch 408a and a signal output from the m-1$_{th}$ dynamic node CHITm-1 and providing the NOR operation result to the word line WLm of the $m_{th}$ memory cell block 404. Thus, the $m_{th}$ word line driver circuit 408 activates the word line WLm of the $m_{th}$ memory cell 404 block at logic 'high' level when the line voltage level VDD of the $m_{th}$ dynamic node CHITm is maintained and the $m_{th}$ dynamic node CHITm-1 discharges until reaching the ground voltage level VSS.

Figure 5:
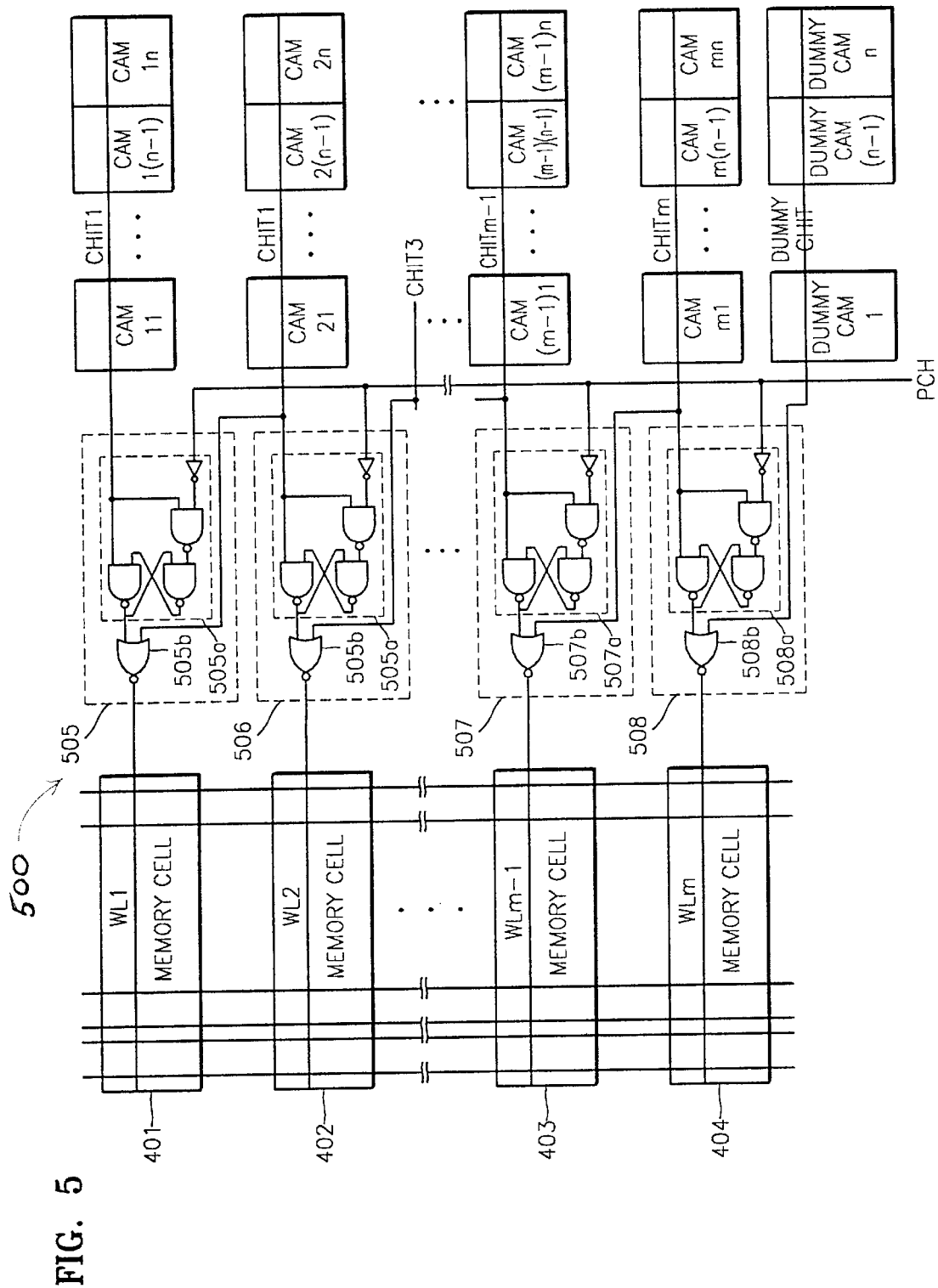
FIG. 5 is a block diagram of a cache memory device according to another embodiment of the present invention.

FIG. 5 is a block diagram of a cache memory device 500 according to another embodiment of the present invention. The cache memory device 500 includes a plurality of memory cell blocks 401 through 404, a plurality of CAM cells 11 to 1n through m1 to mn, a plurality of dummy CAM cells 1 to n, and a plurality of word line driver circuits 505 through 508.

The structures of the memory cell blocks 401 through 404 and the CAM cells 11 to 1n through m1 to mn are the same as those of the memory cell blocks 401 through 404 and the CAM cells 11 to 1n through m1 to mn, according to the embodiment of the present invention shown in FIG. 4. The dummy CAM cells 1 to n are commonly connected to a dummy dynamic node Dummy CHIT.

The structures of the CAM cells 11 to 1n through m1 to mn, and the dummy CAM cells 1 to n are as illustrated in FIG. 2. Therefore, the first through $m_{th}$ dynamic node CHIT1–CHITm and the dummy dynamic node Dummy CHIT are initially precharged to a line voltage level VDD. Also, as in the first embodiment of the present invention, only one of the tag addresses stored in certain CAMs is identical with an address input from a CPU (not shown), i.e., a 'hit' occurs only once at a time for the cache memory device 500. Thus, an address input from the CPU maintains only one of the first through $m_{th}$ dynamic nodes CHIT1 through CHITm at the precharged line voltage level VDD, and causes the remaining dynamic nodes and the dummy dynamic node Dummy CHIT to discharge until reaching a ground voltage level VSS.

In particular, each of the word line driver circuits 505 through 508 drives a word line of a corresponding memory cell block in response to signals output from two adjacent dynamic nodes, and operates according to a method for driving a word line according to the present invention. In detail, the first word line driver circuit 505 drives a word line WL1 of the first memory cell block 401 in response to signals output from the first and second dynamic nodes CHIT1 and CHIT2. The second word line driver circuit 506 drives a word line WL2 of the second memory cell block 402 in response to signals output from the second and third dynamic nodes CHIT2 and CHIT3. Likewise, the $m_{th}$ word line driver circuit 508 drives a word line WLm of the $m_{th}$ memory cell block 404 in response to signals output from the $m_{th}$ dynamic node CHITm and the dummy dynamic node Dummy CHIT.

More specifically, each of the word line driver circuits 505 through 508 includes one of inversion latches 505a through 508a, and one of NOR gates 505b through 508b. The first word line driver circuit 505 activates the word line WL1 of the first memory cell block 401 to logic 'high' level when the line voltage level VDD of the first dynamic node CHIT1 is maintained and as soon as the second dynamic node CHIT2 has discharged, reaching the ground voltage level VSS. The second word line driver circuit 506 activates the word line WL2 of the second memory cell block 402 to logic 'high' level when the line voltage Level VDD of the second dynamic node CHIT2 is maintained and as soon as the third dynamic node CHIT3 has discharged, reaching the ground voltage level VSS. Likewise, the $m_{th}$ word line driver circuit 508 activates the word line WLm of the mth memory cell block 404 at logic 'high' level when the line voltage Level VDD of the mth dynamic node CHITm is maintained and as soon as the the dummy dynamic node Dummy CHIT has been discharged until reaching the ground voltage level VSS.

While this invention has been particularly shown and described with reference to preferred embodiments thereof, it will be understood by those skilled in the art that various changes in form and details may be made therein without departing from the spirit and scope of the invention as defined by the appended claims.

As described above, in a cache memory device according to the present invention, a word line of a memory cell block cell is activated when a precharged line voltage level of one of two adjacent dynamic nodes is maintained and as soon as the other one has discharged to a ground voltage level. Therefore, the operational speed of the word line according to the present invention is faster than a conventional cache memory device, which increases the operational speed of the cache memory device. Meanwhile, a cache memory device according to the preferred embodiment of the present invention shown in FIG. 4 does not include dummy CAM cells, thereby reducing the chip area of a semiconductor integrated circuit.

What is claimed is:

1. A cache memory device comprising:
    a first memory cell block;
    a second memory cell block;
    a plurality of first content addressable memory ("CAM") cells commonly connected to a first dynamic node for storing a tag address of the first memory cell block;
    a plurality of second CAM cells commonly connected to a second dynamic node for storing a tag address of the second memory cell block; and
    a first word line driver circuit coupled to the first and second dynamic nodes for driving a word line of the first memory cell block in response to signals output from the first and second dynamic nodes.

2. The cache memory device of claim 1, further comprising a second word line driver circuit coupled to the first and second dynamic nodes for driving a word line of the second memory cell block in response to signals output from the first and second dynamic nodes.

3. The cache memory device of claim 2, wherein the first and second dynamic nodes are initially precharged to a predetermined level.

4. The cache memory device of claim 3, wherein the precharged predetermined level of the first dynamic node is maintained when an address input from a central processing unit ("CPU") is identical with a tag address stored in the plurality of first CAM cells and, in the reverse case, the first dynamic node is discharged.

5. The cache memory device of claim 3, wherein the precharged predetermined level of the second dynamic node is maintained when an address input from a CPU is identical to a tag address stored in the plurality of second CAM cells and, in the reverse case, the second dynamic node is discharged.

6. The cache memory device of claim 3, wherein the precharged predetermined level of one of the first and second dynamic nodes is maintained and the other one is discharged when an address is input from a CPU.

7. The cache memory device of claim 6, wherein the first word line driver circuit activates the word line of the first memory cell block when the predetermined level of the first dynamic node is maintained and the second dynamic node is discharged.

8. The cache memory device of claim 6, wherein the second word line driver circuit activates the word line of the second memory cell block when the predetermined level of the second dynamic node is maintained and the first dynamic node is discharged.

9. The cache memory device of claim 1, wherein the first word line driver circuit comprises:

an inversion latch for inverting and latching a signal output from the first dynamic node; and a NOR gate for performing a NOR operation on signals output from the inversion latch and the second dynamic node and providing the NOR operation result to the word line of the first memory cell block.

10. The cache memory device of claim 2, wherein the second word line driver circuit comprises:

an inversion latch for inverting and latching a signal output from the second dynamic node; and a NOR gate for performing a NOR operation on signals output from the inversion latch and the first dynamic node and providing the NOR operation result to the word line of the second memory cell block.

11. A cache memory device comprising:

a first memory cell block;

a second memory cell block;

a third memory cell block;

a plurality of first CAM cells commonly connected to a first dynamic node for storing a tag address of the first memory cell block;

a plurality of second CAM cells commonly connected to a second dynamic node for storing a tag address of the second memory cell;

a plurality of third CAM cells commonly connected to a third dynamic node for storing a tag address of the third memory cell block;

a first word line driver circuit coupled to the first and second dynamic nodes for driving a word line of the first memory cell block in response to signals output from the first and second dynamic nodes; and a second word line driver circuit coupled to the second and third dynamic nodes for driving a word line of the second memory cell block in response to signals output from the second and third dynamic nodes.

12. The cache memory device of claim 11, further comprising:

a plurality of dummy CAM cells connected to a dummy dynamic node; and a third word line driver circuit coupled to the third dynamic node and the dummy dynamic node for driving the third memory cell block in response to signals output from the third dynamic node and the dummy dynamic node.

13. The cache memory device of claim 12, wherein the first through third dynamic nodes and the dummy dynamic node are initially precharged to a predetermined level.

14. The cache memory device of claim 13, wherein the precharged predetermined level of the first dynamic node is maintained when an address input from a CPU is identical with a tag address stored in the plurality of first CAM cells and, in the reverse case, the first dynamic node is discharged.

15. The cache memory device of claim 13, wherein the precharged predetermined level of the second dynamic node is maintained when an address input from a CPU is identical with a tag address stored in the plurality of second CAM cells and, in the reverse case, the second dynamic node is discharged.

16. The cache memory device of claim 13, wherein the precharged predetermined level of the third dynamic node is maintained when an address input from a CPU is identical with a tag address stored in the plurality of third CAM cells and, in the reverse case, the third dynamic node is discharged.

17. The cache memory device of claim 13, wherein the precharged predetermined level of the dummy dynamic node is discharged when an address input from a CPU is received.

18. The cache memory device of claim 13, wherein the precharged predetermined level of only one of the first through third dynamic nodes is maintained and the others are discharged when an address is input from a CPU.

19. The cache memory device of claim 18, wherein the first word line driver circuit activates a word line of the first memory cell block when the predetermined level of the first dynamic node is maintained and the second dynamic node is discharged.

20. The cache memory device of claim 18, wherein the second word line driver circuit activates a word line of the second memory cell block when the predetermined level of the second dynamic node is maintained and the third dynamic node is discharged.

21. The cache memory device of claim 18, wherein the third word line driver circuit activates a word line of the third memory cell block when the predetermined level of the third dynamic node is maintained and the dummy dynamic node is discharged.

22. The cache memory device of claim 11, wherein the first word line circuit comprises:

an inversion latch for inverting and latching a signal output from the first dynamic node; and a NOR gate for performing a NOR operation on signals output from the inversion latch and the second dynamic node and providing the NOR operation result to the word line of the first memory cell block.

23. The cache memory device of claim 11, wherein the second word line circuit comprises:

an inversion latch for inverting and latching a signal output from the second dynamic node; and a NOR gate for performing a NOR operation on signals output from the inversion latch and the third dynamic node and providing the NOR operation result to the word line of the second memory cell block.

24. The cache memory device of claim 12, wherein the third word line circuit comprises:

an inversion latch for inverting and latching a signal output from the third dynamic node; and a NOR gate for performing a NOR operation on signals output from the inversion latch and the dummy dynamic node and providing the NOR operation result to the word line of the third memory cell block.

25. A method of driving a word line of a cache memory device including a first memory cell block, a second memory cell block, a plurality of first CAM cells commonly connected to a first dynamic node for storing a tag address for the first memory cell block, and a plurality of second CAM cells commonly connected to a second dynamic node for storing a tag address of the second memory cell block, the method comprising:

initially precharging the first and second dynamic nodes to a predetermined level;

maintaining the precharged predetermined level of the first dynamic node when an address input from the CPU is the same as a tag address stored in the plurality of first CAM cells and, in the reverse case, discharging the first dynamic node;

maintaining the precharged predetermined level of the second dynamic node when the address input from a CPU is the same as a tag address stored in the plurality of second CAM cells and, in the reverse case, discharging the second dynamic node; and activating a word line of the first memory cell block when the predetermined level of the first dynamic node is maintained and the second dynamic node is discharged.

26. The method of claim 25 further comprising activating a word line of the second memory cell block when the predetermined level of the second dynamic node is maintained and the first dynamic node has discharged.

27. The method of claim 25, wherein activating the word line of the first memory cell block comprises:

inverting and latching a signal output from the first dynamic node; and performing a NOR operation on the signal, which is inverted and latched, and a signal output from the second dynamic node and providing the NOR operation result to the word line of the first memory cell block.

28. The method of claim 26, wherein activating the word line of the second memory cell block comprises:

inverting and latching a signal output from the second dynamic node; and performing a NOR operation on the signal, which is inverted and latched, and a signal output from the first dynamic node and providing the NOR operation result to the word line of the second memory cell block.

29. A method of driving a word line of a cache memory device including a first memory cell block, a second memory cell block, a third memory cell block, a plurality of first CAM cells commonly connected to a first dynamic node for storing a tag address for the first memory cell block, a plurality of second CAM cells commonly connected to a second dynamic node for storing a tag address of the second memory cell block, a plurality of third CAM cells commonly connected to a third dynamic node for storing a tag address of the third memory cell block, and a plurality of dummy CAM cells commonly connected to a dummy dynamic node, the method comprising:

initially precharging the first through third dynamic nodes and the dummy dynamic node to a predetermined level;

maintaining the precharged predetermined level of the first dynamic node when an address input from a CPU is the same as a tag address stored in the plurality of first CAM cells and, in the reverse case, discharging the first dynamic node;

maintaining the precharged predetermined level of the second dynamic node when the address input from the CPU is the same as a tag address stored in the plurality of second CAM cells and, in the reverse case, discharging the second dynamic node;

maintaining the precharged predetermined level of the third dynamic node when the address input from the CPU is the same as a tag address stored in the plurality of third CAM cells and, in the reverse case, discharging the third dynamic node;

activating a word line of the first memory cell block when the predetermined level of the first dynamic node is maintained and the second dynamic node is discharged; and activating a word line of the second memory cell block when the predetermined level of the second dynamic node is maintained and the third dynamic node is discharged.

30. The method of claim 28 further comprising:

discharging the precharged predetermined level of the dummy dynamic node when the address is input from the CPU; and activating a word line of the third memory cell block when the predetermined level of the third dynamic node is maintained and the dummy dynamic node is discharged.

31. The method of claim 29, wherein activating the word line of the first memory cell block comprises:

inverting and latching a signal output from the first dynamic node; and performing a NOR operation on the signal, which is inverted and latched, and a signal output from the second dynamic node and providing the NOR operation result to the word line of the first memory cell block.

32. The method of claim 29, wherein activating the word line of the second memory cell block comprises:

inverting and latching a signal output from the second dynamic node; and performing a NOR operation on the signal, which is inverted and latched, and a signal output from the third dynamic node and providing the NOR operation result to the word line of the second memory cell block.

33. The method of claim 29, wherein activating the word line of the third memory cell block comprises:

inverting and latching a signal output from the third dynamic node; and performing a NOR operation on the signal, which is inverted and latched, and a signal output from the dummy dynamic node and providing the NOR operation result to the word line of the third memory cell block.

* * * * *